United States Patent [19]
Brown

[11] 3,932,239
[45] Jan. 13, 1976

[54] SEMICONDUCTOR DIFFUSION PROCESS

[75] Inventor: William A. Brown, Wappingers Falls, N.Y.

[73] Assignee: Cogar Corporation, Utica, N.Y.

[22] Filed: Oct. 27, 1970

[21] Appl. No.: 84,276

[52] U.S. Cl................................. 148/186; 148/188
[51] Int. Cl.²..................................... H01L 21/225
[58] Field of Search ............ 148/186, 189, 188, 187

[56] References Cited
UNITED STATES PATENTS

| | | | |
|---|---|---|---|
| 3,365,794 | 1/1968 | Botka.............................. | 148/187 X |
| 3,398,029 | 8/1968 | Yasufuku et al..................... | 148/187 |
| 3,442,725 | 5/1969 | Huffman et al..................... | 148/189 |
| 3,474,310 | 10/1969 | Ono et al......................... | 148/186 X |

OTHER PUBLICATIONS

"Integrated Circuits," Warner, Jr., (Ed.), McGraw Hill Book Co., N.Y., 1965, pp. 289–290, 304–305.

*Primary Examiner*—L. Dewayne Rutledge
*Assistant Examiner*—J. M. Davis
*Attorney, Agent, or Firm*—Harry M. Weiss

[57] ABSTRACT

This disclosure is directed to a semiconductor diffusion process for diffusing impurities into a semiconductor substrate. Open tube phosphorous diffusion process conditions are described wherein diffused region depth control is achieved by the initial deposition time. This permits creation of a diffused region having the benefits of low sheet resistance and shallow depth. Additionally, the diffusion process enables the formation of very thick thermal oxide layers which are particularly useful in MOS or FET device fabrication.

54 Claims, 3 Drawing Figures

SEMICONDUCTOR DIFFUSION PROCESS

FIELD OF THE INVENTION

This invention relates generally, to a semiconductor diffusion process and more particularly, to an open tube semiconductor diffusion process using phosphorous as the source impurity and a silicon substrate.

DESCRIPTION OF THE PRIOR ART

Conventionally, the formation of diffused semiconductor regions in a semiconductor substrate such as silicon is achieved by either capsule (closed tube) diffusion, open tube diffusion, doped oxide diffusion, or ion implantation techniques. Each of these prior art techniques have advantages and disadvantages associated therewith. In the use of an open tube diffusion process for the formation of diffused layers of N-type conductivity in a silicon substrate, phosphorous is often used as the dopant or source material. Particularly, in fabricating the emitter region of an NPN transistor device, it is considered quite within the skill of the art to use phosphorous as the impurity source in an open tube diffusion operation. Similarly, in making N-channel MOS devices of the type described in the co-pending patent application filed concurrently herewith and entitled "FET Memory Chip Including FET Devices Therefor and Fabrication Method" assigned to the same assignee of this invention, an N-type diffusion operation is carried out for forming both the source and drain diffused regions which uses phosphorous in an open tube diffusion process.

In either case, whether one was manufacturing NPN transistor devices or N-channel MOS devices, it often became essential that the diffused region have a minimum depth with low sheet resistance. This is especially important in fabricating high speed devices requiring narrow channel widths (base width or gate channel). This was considered to be a real problem in the semiconductor industry since extended heating times and high source concentrations required to reduce the sheet resistance caused an increase in junction depth, and therefore, it was very difficult to obtain an optimum shallow depth diffused region with low sheet resistance. In the manufacture of a bipolar transistor device such as an NPN device, the importance of a shallow diffused region was quite evident in the fabrication of very high speed devices which required precise control of the space (base width) between the emitter and collector junctions. The narrower the base width or region between the emitter and collector junctions the higher the speed of the device and, consequently, it is highly desirable to carry out a diffusion process which would result in a very shallow depth junction for the emitter region. Arsenic emitters are being considered and used to avoid the problem of obtaining shallow diffused regions with phosphorous. This was even more important when it was considered that other steps in the process had to be carried out which would affect the diffusion depth of the preformed phosphorous emitter diffused region. Similarly, in the formation of an N-channel MOS structure, the diffused regions forming the source and drain of the MOS or FET device had to be formed in a manner that would provide minimum change of diffusion depth during subsequent gate processing.

One of the previous problems with growing thermal thick oxide regions subsequent to the formation of diffused regions in a semiconductor structure such as the formation of an N-type emitter region in NPN structures or the formation of N-type source and drain regions in MOS structures was that the thermal thick oxide layers, which were desired over certain regions of the semiconductor substrate, could not be achieved because of the increased time and temperatures needed to form the thick oxide layers which resulted in undesired increased junction depths. This resulted in destruction or modification of original diffusion profiles or regions in the semiconductor structure. Consequently a need existed for the development of a semiconductor diffusion process which could achieve reduced or retarded diffusion depth with low sheet resistance while still yielding the advantages of permitting the formation of thick thermal oxide films.

SUMMARY OF THE INVENTION

It is an object of this invention to provide an improved semiconductor diffusion process.

It is another object of this invention to provide an improved open tube semiconductor diffusion process.

It is still another object of this invention to provide an improved open tube phosphorous semiconductor diffusion process using $POCl_3$ as the source of phosphorous.

It is still a further object of this invention to provide an improved process for forming shallow, diffused, N-type regions with reduced sheet resistivity and thick oxide surface regions for MOS and bipolar devices.

The foregoing, and other objects, features, and advantages of the invention will be apparent from the following, more particular description of the preferred embodiments of the invention, as illustrated in the accompanying drawing.

BRIEF DESCRIPTION OF THE DRAWINGS

Referring to FIG. 1, the sheet resistance in ohms per square defining the ordinate of the graph of this figure is shown having gradients of 5 ohms per square while the phosphorous oxy-chloride deposition time represented by the abscissa has 5 minute intervals per gradient. Curve 1 illustrated in FIG. 1 indicates the reduction in sheet resistance from a peak of over 34 ohms per square to a low of about 20 ohms per square for deposition times ranging from 10 minutes to about 40 minutes at a temperature of about 900°C. This is a standard expected change in sheet resistance for the particular deposition temperature.

Curve 2 depicts the rapid drop in sheet resistivity significantly below that of curve 1 for the same deposition temperature of 900°C, but with a reoxidation of 5 minutes in dry oxygen, 120 minutes in steam plus oxygen, 5 minutes in dry oxygen. As can be seen from this curve, the sheet resistance drop is significantly greater after a reoxidation operation, as noted.

Curve 3 illustrates, similar to curve 1, the change in sheet resistivity that occurs for a diffused region formed by a POCl$_3$ diffusion process having a deposition temperature of 920°C.

Figure 1:
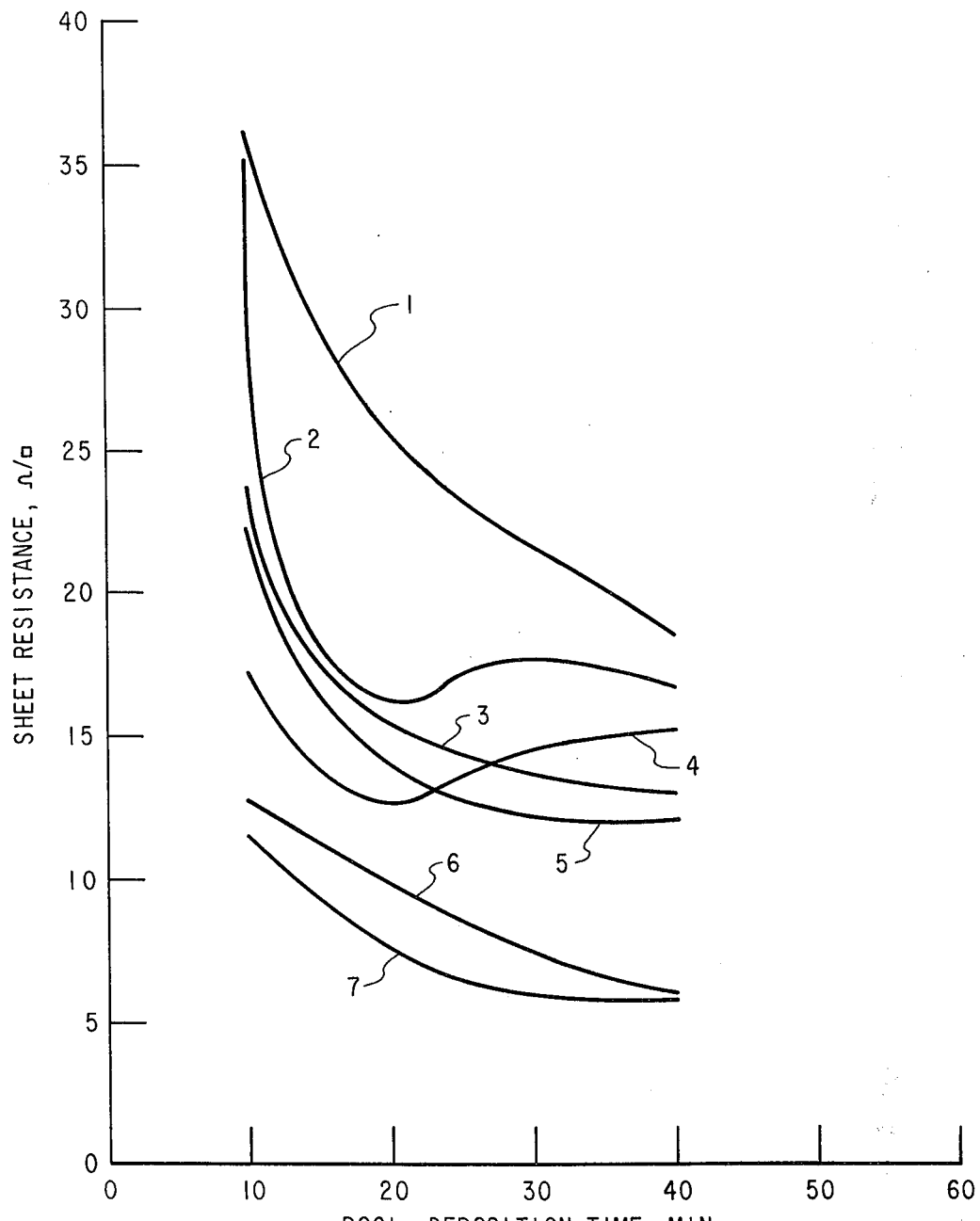
FIG. 1 illustrates in a graph (having sheet resistance as the ordinate and deposition time as the abscissa) a series of curves depicting different sheet resistivity levels that are achieved for various processing conditions including deposition and post-deposition reoxidation operations.

Curve 4 is a curve similar to curve 2 of FIG. 1 except that it shows the reduced sheet resistance that is achieved for a deposition temperature of 920°C and a reoxidation temperature of about 900°C for 5–120–5 minutes.

Curve 5 is a curve depicting the reduction in sheet resistance for an open tube phosphorous diffusion operation at a deposition temperature of 900°C and a reoxidation for 5–180–0 minutes at about 900°C.

Curve 6 is a curve depicting the change in sheet resistivity with increased deposition time for an open tube phosphorous diffusion operation carried out at a deposition temperature of about 900°C and at a reoxidation time of 5–180–0 minutes at 900°C plus an additional heat treatment for 56 minutes at about 1000°C in dry oxygen.

Curve 7 is a curve similar to curve 6 but at a deposition temperature of 920°C and a reoxidation time of 5–120–5 minutes at about 900°C plus an additional heat treatment for 56 minutes at about 1,000°C in dry oxygen.

As can be seen from looking at curves 1, 2, 5 and 6, the increased reoxidation time and post reoxidation heat treatments significantly reduced the sheet resistivity for the same time and temperature of deposition. Similarly, curves 3, 4 and 7 show the same effect for the same deposition time at a deposition temperature of 920°C.

Figure 2:
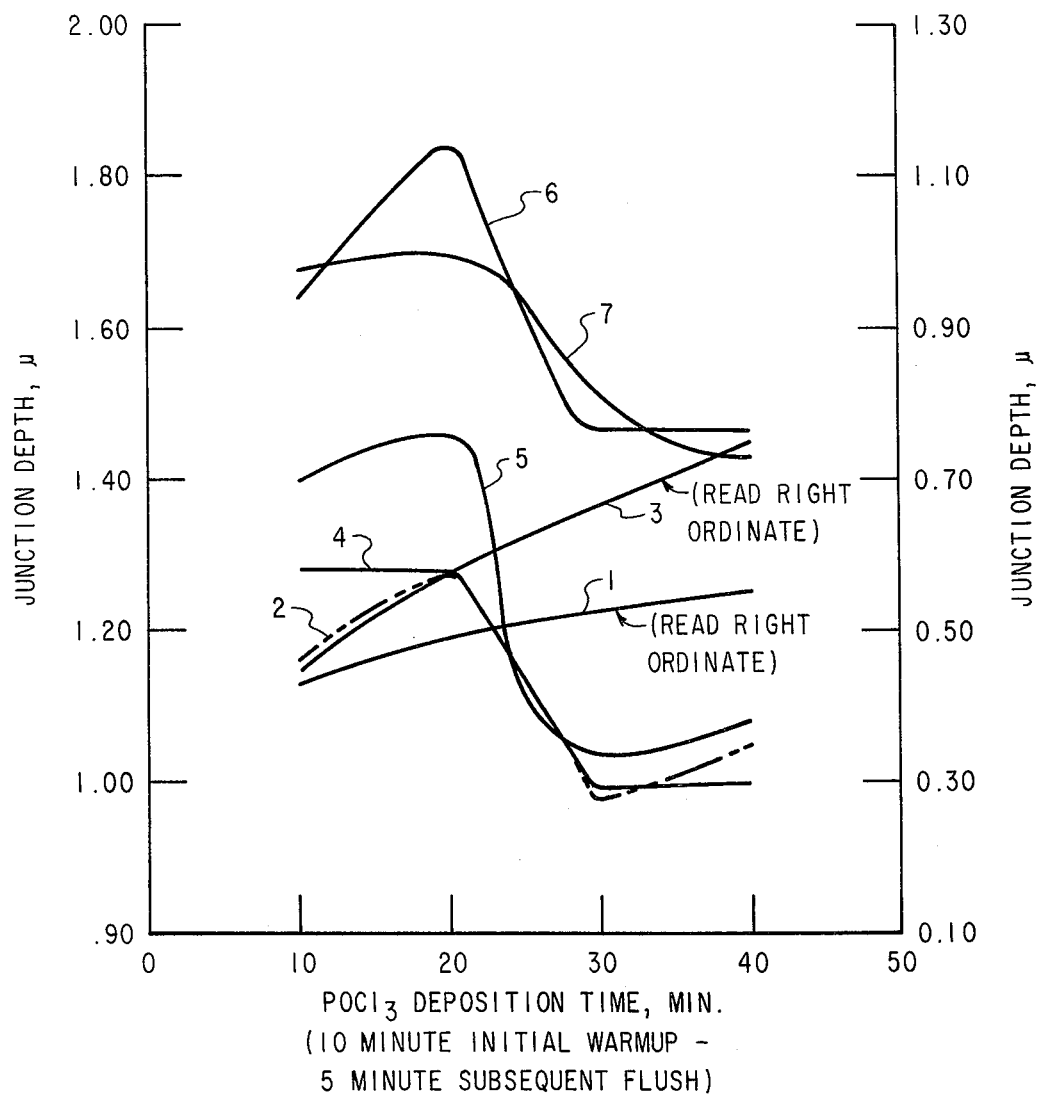
FIG. 2 illustrates in a graph (having junction depth as the left and right ordinates and deposition time as the abscissa) a series of curves illustrating the change in junction depth for different processing conditions including deposition and reoxidation operations.

Referring to FIG. 2, curves 1, 2, 3, 4, 5, 6 and 7 correspond to the similar numbered curves of FIG. 1 and depict different diffused region junction depths for the different processing conditions including deposition and reoxidation. Curve 1 of FIG. 2 shows the increase in junction depth with increased deposition time for a deposition temperature of about 900°C. This is expected in accordance with previous semiconductor diffusion experiences.

Curve 2 shows the initial increase and subsequent decrease in junction depth for the operation where the deposition temperature is about 900°C and a reoxidation operation is carried out for a time of 5–120–5 minutes at about 900°C. This is significant since it shows that the junction depth decreases substantially after the reoxidation step (>20 min. deposition time).

Curves 3 and 4 are substantially similar to curves 1 and 2 and depict the diffused junction depths that are achieved with respect to increased POCl$_3$ deposition time deposition time for a diffusion process that is carried out at 920°C deposition.

Curve 5 illustrates the drop in junction depth with increased deposition time for a diffusion operation carried out at about a 900°C deposition temperature and at a reoxidation time of 5–180–0 minutes at about 900°C temperature.

Curve 6 illustrates the change in junction depth with increased phosphorous deposition time for the conditions where the deposition temperature is 900°C and the reoxidation operation is carried out for a time period of 5–180–0 minutes at 900°C followed by 56 minutes at 1,000°C in dry oxygen.

Curve 7 depicts the retardation of the junction depth with increased deposition time for a diffusion operation carried out at about a 920°C deposition temperature followed by a reoxidation time of 5–120–5 minutes at about 900°C plus 56 minutes at 1,000°C in dry oxygen.

From viewing FIGS. 1 and 2, the achievement of reduced junction depth and decreased sheet resistance is accomplished during a phosphorous oxy chloride diffusion operation under certain post deposition conditions. The junction depth retardation and sheet resistance reduction effects achieved by the diffusion operation of this process should also be achieved with other diffusion sources such as boron, arsenic, etc. and in other systems such as closed tubes, etc. The data shown in FIGS. 1 and 2 are achieved with a source concentration level of 3,550 parts per million of POCl$_3$ in the processing gas stream. An oxygen level of 20% of the total gas volume flow is maintained. The remainder of the gas flow is made of Argon gas. The silicon wafers used are of P type (2 ohm-centimeter) having a crystallographic orientation of (100). Uniform, non-ragged junctions are achieved hereby.

Figure 3:
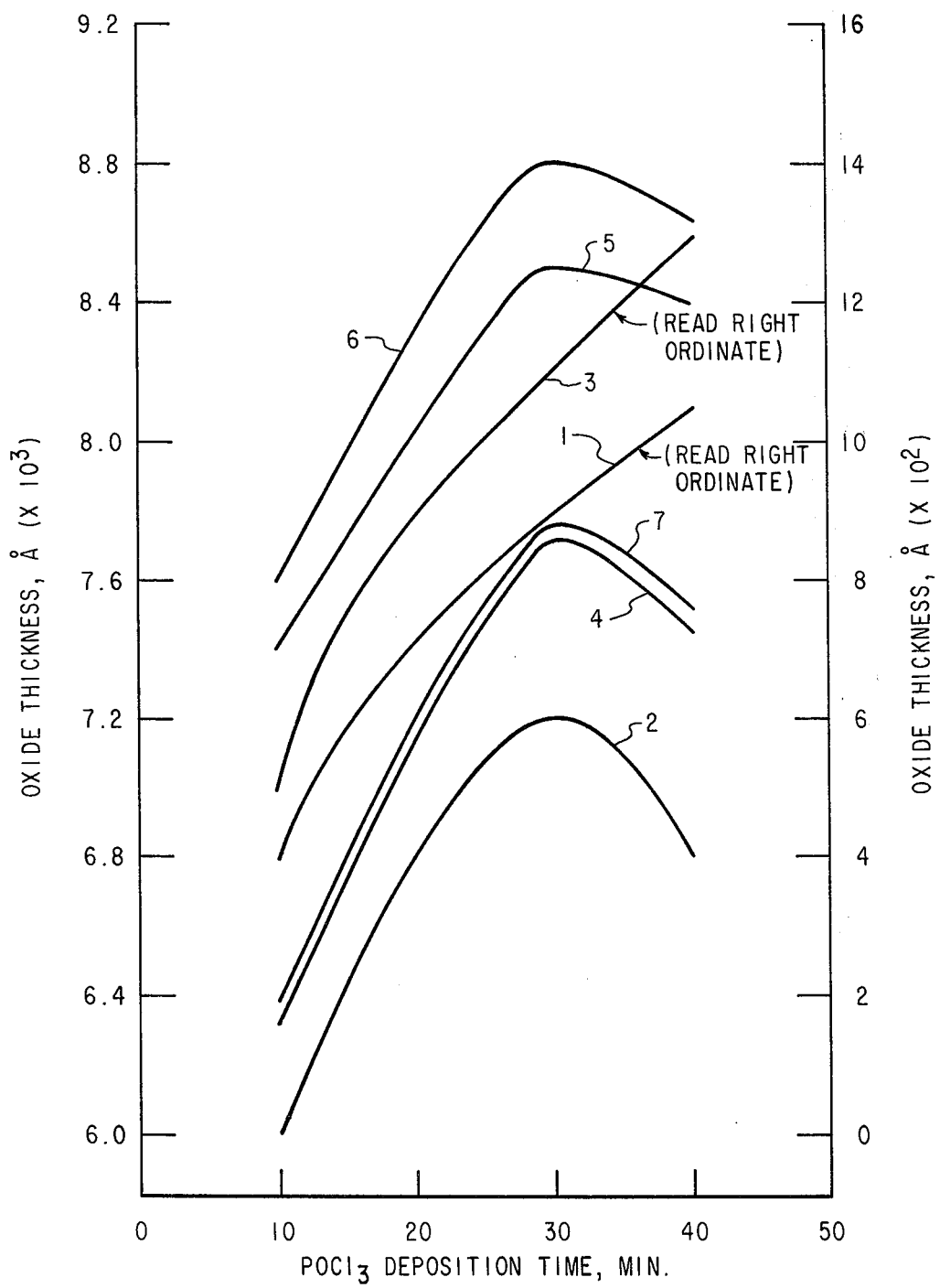
FIG. 3 illustrates in a graph (having oxide thickness as the left and right ordinate and deposition time as the abscissa) a series of curves showing increased thermal oxide thickness for various processing conditions including deposition and reoxidation operations.

FIG. 3 is a graph showing the changes in oxide thickness for various processing conditions including deposition and reoxidation operations. Curves 1, 2, 3, 4, 5, 6 and 7 in this figure are comparison curves to the same numbered curves shown in FIGS. 1 and 2 depicting sheet resistance and junction depth, respectively. FIG. 3, therefore, illustrates the type of thermally grown oxide thickness that can be achieved using the associated processing conditions for each curve. Accordingly, by means of the information contained in FIGS. 1, 2 and 3, one skilled in the art can pick out a selected oxide thickness, sheet resistance and junction depth approximate to selected device requirements.

While the invention has been particularly shown and described in reference to the preferred embodiments thereof, it will be understood by those skilled in the art that changes in the form and details may be made therein without departing from the spirit and scope of the invention.

What is claimed is:

1. A method for controlling the junction depth of a diffused semiconductor region having a certain sheet resistance and a PN junction located within a silicon substrate comprising the step of:
   reoxidizing the silicon substrate surface for a period of time and at a temperature sufficient to reduce the junction depth of said diffused semiconductor region to a desired level.

2. A method in accordance with claim 1 wherein said diffused semiconductor region is of N type conductivity and contains phosphorous atoms.

3. A method in accordance with claim 2 wherein said phosphorous atoms are inserted into said diffused semiconductor region during an open tube diffusion operation.

4. A method in accordance with claim 3 wherein phosphorous oxychloride is used in the phosphorous source in said open tube diffusion operation.

5. A method in accordance with claim 2 whereion said reoxidizing step is carried out at a temperature of about 900°C.

6. A method in accordance with claim 5 wherein said reoxidizing step is carried out for a period of about 5 minutes in dry oxygen followed by 120 minutes in steam plus oxygen followed by 5 minutes in dry oxygen.

7. A method in accordance with claim 5 wherein said reoxidizing step is carried out for a period of about 5 minutes in dry oxygen followed by 180 minutes in steam plus oxygen.

8. A method in accordance with claim 6 wherein said reoxidizing step is followed by a heat treatment for about 56 minutes in dry oxygen at a temperature of about 1,000°C.

9. A method in accordance with claim 7 wherein said reoxidizing step is followed by a heat treatment for about 56 minutes in dry oxygen at a temperature of about 1,000°C.

10. A method for controlling the junction depth of a diffused semiconductor region having a certain sheet resistance and a PN junction located within in a silicon substrate comprising the steps of:
   depositing a diffusion source, doped glass layer on a silicon substrate and in contact with at least one surface region of said silicon substrate; and
   reoxidizing the silicon substrate surface for a period of time and at a temperature sufficient to reduce the junction depth of said diffused semiconductor region to a desired level.

11. A method in accordance with claim 10 wherein said doped glass layer is deposited at a temperature in the range of from about 900°C to about 920°C.

12. A method in accordance with claim 11 wherein said doped glass layer is a phosphorous doped glass layer.

13. A method in accordance with claim 12 wherein said phosphorous doped glass layer is formed in an open tube diffusion operation using phosphorous oxychloride as the phosphorous source.

14. A method in accordance with claim 12 wherein said reoxidizing step is carried out at a temperature of about 900°C.

15. A method in accordance with claim 14 wherein said reoxidizing step is carried out for a period of about 5 minutes in dry oxygen followed by 120 minutes in steam plus oxygen followed by 5 minutes in dry oxygen.

16. A method in accordance with claim 14 wherein said reoxidizing step is carried out for a period of about 5 minutes in dry oxygen followed by 180 minutes in steam plus oxygen.

17. A method in accordance with claim 15 wherein said reoxidizing step is followed by a heat treatment for about 56 minutes in dry oxygen at a temperature of about 1,000°C.

18. A method in accordance with claim 16 wherein said reoxidizing step is followed by a heat treatment for about 56 minutes in dry oxygen at a temperature of about 1,000°C.

19. A method for controlling the junction depth and sheet resistance of a diffused semiconductor region having a certain sheet resistance and a PN junction located within a silicon substrate comprising the step of:
   reoxidizing the silicon substrate surface for a period of time and at a temperature sufficient to reduce the junction depth and sheet resistance of said diffused semiconductor region to a desired level.

20. A method in accordance with claim 19 wherein said diffused semiconductor region is of N type conductivity and contains phosphorous atoms.

21. A method in accordance with claim 20 wherein said phosphorous atoms are inserted into said diffused semiconductor region during an open tube diffusion operation.

22. A method in accordance with claim 21 wherein phosphorous oxychloride is used as the phosphorous source in said open tube diffusion operation.

23. A method in accordance with claim 20 wherein said reoxidizing step is carried out at a temperature of about 900°C.

24. A method in accordance with claim 23 wherein said reoxidizing step is carried out for a period of about 5 minutes in dry oxygen followed by 120 minutes in steam plus oxygen followed by 5 minutes in dry oxygen.

25. A method in accordance with claim 23 wherein said reoxidizing step is carried out for a period of about 5 minutes in dry oxygen followed by 180 minutes in steam plus oxygen.

26. A method in accordance with claim 24 wherein said reoxidizing step is followed by a heat treatment for about 56 minutes in dry oxygen at a temperature of about 1,000°C.

27. A method in accordance with claim 25 wherein said reoxidizing step is followed by a heat treatment for about 56 minutes in dry oxygen at a temperature of about 1,000°C.

28. A method for controlling the junction depth and sheet resistance of a diffused semiconductor region having a certain sheet resistance and a PN junction located within a silicon substrate comprising the steps of:
   depositing a diffusion source, doped glass layer on a silicon substrate and in contact with at least one surface region of said silicon substrate; and
   reoxidizing the silicon substrate surface for a period of time and at a temperature sufficient to reduce the junction depth of said diffused semiconductor region to a desired level.

29. A method in accordance with claim 28 wherein said doped glass layer is deposited at a temperature in the range of from about 900°C to about 920°C.

30. A method in accordance with claim 29 wherein said doped glass layer is a phosphorous doped glass layer.

31. A method in accordance with claim 30 wherein said phosphorous doped glass layer is formed in an open tube diffusion operation using phosphorous oxychloride as the phosphorous source.

32. A method in accordance with claim 29 wherein said reoxidizing step is carried out at a temperature of about 900°C.

33. A method in accordance with claim 32 wherein said reoxidizing step is carried out for a period of about 5 minutes in dry oxygen followed by 120 minutes in steam plus oxygen followed by 5 minutes in dry oxygen.

34. A method in accordance with claim 32 wherein said reoxidizing step is carried out for a period of about 5 minutes in dry oxygen followed by 180 minutes in steam plus oxygen.

35. A method in accordance with claim 33 wherein said reoxidizing step is followed by a heat treatment for about 56 minutes in dry oxygen at a temperature of about 1,000°C.

36. A method in accordance with claim 34 wherein said reoxidizing step is followed by a heat treatment for about 56 minutes in dry oxygen at a temperature of about 1,000°C.

37. A method for controlling the junction depth and sheet resistance of a diffused semiconductor region having a certain sheet resistance and a PN junction located within a silicon substrate and selecting the thermal oxide thickness of an oxide layer on the silicon substrate surface comprising the step of:

reoxidizing the silicon substrate surface for a period of time and at a temperature sufficient to reduce the junction depth and sheet resistance of said diffused semiconductor region to a desired level corresponding to a desired oxide thickness.

38. A method in accordance with claim 37 wherein said diffused semiconductor region is of N type conductivity and contains phosphorous atoms.

39. A method in accordance with claim 38 wherein said phosphorous atoms are inserted into said diffused semiconductor region during an open tube diffusion operation.

40. A method in accordance with claim 39 wherein phosphorous oxychloride is used as the phosphorous source in said open tube diffusion operation.

41. A method in accordance with claim 38 wherein said reoxidizing step is carried out at a temperature of about 900°C.

42. A method in accordance with claim 41 wherein said reoxidizing step is carried out for a period of about 5 minutes in dry oxygen followed by 120 minutes in steam plus oxygen followed by 5 minutes in dry oxygen.

43. A method in accordance with claim 41 wherein said reoxidizing step is carried out for a period of about 5 minutes in dry oxygen followed by 180 minutes in steam plus oxygen.

44. A method in accordance with claim 42 wherein said reoxidizing step is followed by a heat treatment for about 56 minutes in dry oxygen at a temperature of about 1,000°C.

45. A method in accordance with claim 43 wherein said reoxidizing step is followed by a heat treatment for about 56 minutes in dry oxygen at a temperature of about 1,000°C.

46. A method for controlling the junction depth and sheet resistance of a diffused semiconductor region having a certain shut resistance and a PN junction located within a silicon substrate and selecting the thermal oxide thickness of an oxide layer on the silicon substrate surface comprising the steps of:

depositing a diffusion source, doped glass layer on an oxide layer located on a silicon substrate and in contact with at least one exposed surface region of said silicon substrate; and reoxidizing the silicon substrate surface for a period of time and at a temperature sufficient to reduce the junction depth and sheet resistance of said diffused semiconductor region to a desired level corresponding to a desired oxide thickness.

47. A method in accordance with claim 26 wherein said doped glass layer is deposited at a temperature in the range of from about 900°C to about 920°C.

48. A method in accordance with claim 47 wherein said doped glass layer is a phosphorous doped glass layer.

49. A method in accordance with claim 48 wherein said phosphorous doped glass layer is formed in an open tube diffusion operation using phosphorous oxychloride as the phosphorous source.

50. A method in accordance with claim 47 wherein said reoxidizing step is carried out at a temperature of about 900°C.

51. A method in accordance with claim 50 wherein said reoxidizing step is carried out for a period of about 5 minutes in dry oxygen followed by 120 minutes in steam plus oxygen followed by 5 minutes in dry oxygen.

52. A method in accordance with claim 50 wherein said reoxidizing step is carried out for a period of about 5 minutes in dry oxygen followed by 180 minutes in steam plus oxygen.

53. A method in accordance with claim 51 wherein said reoxidizing step is followed by a heat treatment for about 56 minutes in dry oxygen at a temperature of about 1,000°C.

54. A method in accordance with claim 52 wherein said reoxidizing step is followed by a heat treatment for about 56 minutes in dry oxygen at a temperature of about 1,000°C.

* * * * *